(12) United States Patent
Ryu et al.

(10) Patent No.: US 9,123,407 B2
(45) Date of Patent: Sep. 1, 2015

(54) DEVICES AND METHODS FOR DECIDING DATA READ START

(71) Applicant: Samsung Electronics Co., Ltd., Suwon-Si, Gyeonggi-Do (KR)

(72) Inventors: Je-Min Ryu, Seoul (KR); Sung-Min Seo, Seoul (KR); Ju-Seop Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 9 days.

(21) Appl. No.: 14/073,987

(22) Filed: Nov. 7, 2013

(65) Prior Publication Data

US 2014/0219038 A1 Aug. 7, 2014

(30) Foreign Application Priority Data

Feb. 5, 2013 (KR) .................. 10-2013-0013026

(51) Int. Cl.
*G11C 7/22* (2006.01)
*G11C 7/10* (2006.01)
*G11C 29/02* (2006.01)
*G11C 7/20* (2006.01)
*G11C 7/08* (2006.01)
*G11C 29/44* (2006.01)

(52) U.S. Cl.
CPC ............... *G11C 7/20* (2013.01); *G11C 7/1063* (2013.01); *G11C 7/22* (2013.01); *G11C 7/222* (2013.01); *G11C 29/028* (2013.01); *G11C 2029/4402* (2013.01)

(58) Field of Classification Search
CPC ........... G11C 7/20; G11C 7/22; G11C 7/1063
USPC .................. 365/189.15, 189.07, 201, 200
See application file for complete search history.

(56) References Cited

U.S. PATENT DOCUMENTS

| 7,746,699 | B1 | 6/2010 | Edwards et al. | |
|---|---|---|---|---|
| 7,885,117 | B2 | 2/2011 | Shin et al. | |
| 2004/0264268 | A1* | 12/2004 | Fukumoto | ..................... 365/200 |
| 2014/0226426 | A1* | 8/2014 | Uvieghara et al. | ............ 365/226 |

FOREIGN PATENT DOCUMENTS

| KR | 100192490 B1 | 6/1999 |
|---|---|---|
| KR | 100192519 B1 | 6/1999 |
| KR | 1020040078418 A | 9/2004 |
| KR | 1020090119223 A | 11/2009 |

* cited by examiner

*Primary Examiner* — Hoai V Ho
*Assistant Examiner* — Jay Radke
(74) *Attorney, Agent, or Firm* — Harness, Dickey & Pierce

(57) ABSTRACT

A data read start decision device includes: a storing circuit configured to store code key data; a read check circuit configured to output a read start signal in response to code key data read from the storing circuit, and a controller configured to start reading environment setting data from the storing circuit in response to the read start signal. The read check circuit is configured to at least one of: receive the read start signal from the controller and transfer the read start signal to the controller in response to the read code key data; and generate the read start signal based on the read code key data and output the read start signal to the controller.

19 Claims, 14 Drawing Sheets

DEVICES AND METHODS FOR DECIDING DATA READ START

CROSS-REFERENCE TO RELATED APPLICATION

This application claims priority under 35 U.S.C. §119 to Korean Patent Application No. 10-2013-0013026 filed on Feb. 5, 2013, the disclosure of which is hereby incorporated by reference in its entirety.

BACKGROUND

1. Field

Example embodiments of inventive concepts relate to semiconductor devices. More specifically, example embodiments of inventive concept relate to devices and/or methods for deciding read start of environment setting data.

2. Description of Related Art

In order to store various information for setting operation environment of a semiconductor memory device, technology which employs a circuit configured to store environment setup data including a one-time programmable (OTP) nonvolatile memory, a fuse circuit, etc. has been generally used.

Redundancy information about a memory cell having a defect, DC level trimming information of a semiconductor memory device, mode register set (MRS) information, etc. may be stored in the circuit configured to store environment setup data.

A laser fuse of which interconnection is controlled by laser irradiation, an electrical fuse of which interconnection is controlled by an electrical signal, or an anti-fuse circuit which changes a high resistance state to a low resistance state, etc. may be used as the fuse circuit.

Since an error in reading the environment setup data may cause an error in operating a semiconductor memory device, technology for suppressing and/or preventing the error in reading the environment setup data may be required.

SUMMARY

Example embodiments of inventive concepts provide devices and methods for deciding a data read start point, which may suppress and/or prevent data reading errors.

Other example embodiments of inventive concepts provide devices and methods for deciding a data read start point, which may suppress and/or prevent data reading errors by adjusting data sensing conditions.

The technical objectives of inventive concepts are not limited to the above disclosure; other objectives may become apparent to those of ordinary skill in the art based on the following descriptions.

At least one example embodiment provides data read start decision device including: a storing circuit configured to store code key data; a read check circuit configured to output a read start signal in response to code key data read from the storing circuit; and a controller configured to start reading environment setting data from the storing circuit in response to the read start signal. The read check circuit is configured to at least one of: receive the read start signal from the controller and transfer the read start signal to the controller in response to the read code key data; and generate the read start signal based on the read code key data and output the read start signal to the controller.

The read code key data may include: n-bit data with an alternately repeating pattern having equal numbers of 0 and 1 bits, and the read check circuit may be further configured to output the read start signal to the controller when the read code key data has n/2 rising edges or n/2 falling edges.

The read code key data may include n-bit data with an alternately repeating pattern having equal numbers of 0 and 1 bits, the read check circuit may include n/2 transfer devices connected in series, and the n/2 transfer devices may be configured to sequentially transfer the read start signal in response to a rising edge or a falling edge in the read code key data.

The read check circuit may be configured to detect rising and falling edges in the read code key data, and output the read start signal when a location of each of the detected rising and falling edges corresponds to a reference location.

The read check circuit may include a logic circuit configured to generate the read start signal when the read code key data is the same as the stored code key data.

The data read start decision device may further include a sensing circuit configured to sense data stored in the storing circuit. The controller may be further configured to: set the sensing circuit in a first sensing mode and perform a first read check operation with respect to the read code key data; and when a read check operation condition is satisfied, set the sensing circuit in a second sensing mode and perform a second read check operation with respect to the read code key data.

A sensitivity of the sensing circuit in the second sensing mode may be higher than the sensitivity of the sensing circuit in the first sensing mode.

The read check operation condition may indicate whether a number of repetitions of a read check process has reached a threshold. The read check process may include reading of the code key data from the storing circuit and the performing of the first read check operation with respect to the read code key data.

At least one other example embodiment provides a data read start decision device including: a storing circuit configured to store code key data; a read check circuit configured to output a read start signal in response to code key data read from the storing circuit, the read check circuit including n sectional read check blocks, and the read code key data being divided into n sections; and a controller configured to read environment setting data from the storing circuit in response to the read start signal. Each of the n sectional read check blocks is configured to at least one of: receive the read start signal from the controller and transfer a section of the received read start signal to the controller in response to a corresponding section of the read code key data; and generate a section of the read start signal based on the corresponding section of the read code key data and output the generated section of the read start signal to the controller.

The controller may be configured to begin reading the environment setting data from the storing circuit when sections of the read start signal are received from all of the n sectional read check blocks.

The data read start decision device may further include a sensing circuit configured to sense data stored in the storing circuit. The controller may be further configured to: set the sensing circuit in a first sensing mode, and perform a first sectional read check operation with respect to the n sections of the read code key data; and when a sectional read check operation condition is satisfied, set the sensing circuit in a second sensing mode, and perform a second sectional read check operation with respect to the n sections of the read code key data.

The sectional read check operation condition may indicate whether the first sectional read check operation has failed with respect to a threshold number of consecutive sections of the read code key data.

Each of the n sections of the read code key data may include k-bit data with an alternately repeating pattern of equal numbers of 0 and 1 bits, and each of the n sectional read check blocks may be configured to transfer the section of the received read start signal to the controller when the corresponding section of the read code key data has k/2 rising edges or k/2 falling edges.

Each of the n sections of the read code key data may include k-bit data with an alternately repeating pattern of equal numbers of 0 and 1 bits, and each of the n sectional read check blocks may include: k/2 transfer devices connected in series, the k/2 transfer devices being configured to sequentially transfer the section of the read start signal in response to a rising edge or a falling edge in the corresponding section of the read code key data.

Each of the sectional read check blocks may include a logic circuit configured to generate the section of the read start signal based on a comparison between bits of the corresponding section of the read code key data.

At least one other example embodiment provides data read start decision device including: a controller configured to read environment setting data from a storing circuit in response to a read start signal; and a read check circuit configured to at least one of (i) receive the read start signal from the controller and transfer the read start signal to the controller in response to code key data read from the storing circuit, and (ii) generate the read start signal based on the read code key data and output the read start signal to the controller.

The read code key data may include multi-bit data, and the read check circuit may include a plurality of transfer devices connected in series. The plurality of transfer devices may be configured to sequentially transfer the read start signal to the controller in response to a rising edge or a falling edge of the read code key data.

The data read start decision device may further include a sensing circuit configured to sense data stored in the storing circuit. The controller may be further configured to: perform a first read check operation with respect to the read code key data; and when a read check operation condition is satisfied, increase the sensitivity of the sensing circuit, read the code key data from the storing circuit, and perform a second read check operation with respect to the read code key data.

The e read code key data may include n sections, and the read check circuit may include n sectional read check blocks. Each of the n sectional read check blocks may be configured to at least one of: receive the read start signal from the controller and transfer a section of the received read start signal to the controller in response to a corresponding section of the read code key data; and generate a section of the read start signal in response to the corresponding section of the read code key data, and output the generated section of the read start signal to the controller.

The controller may be configured to begin reading the environment setting data from the storing circuit when sections of the read start signal are received from all of the n sectional read check blocks.

BRIEF DESCRIPTION OF THE DRAWINGS

The foregoing and other features and advantages of inventive concepts will be apparent from the more particular description of example embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1:
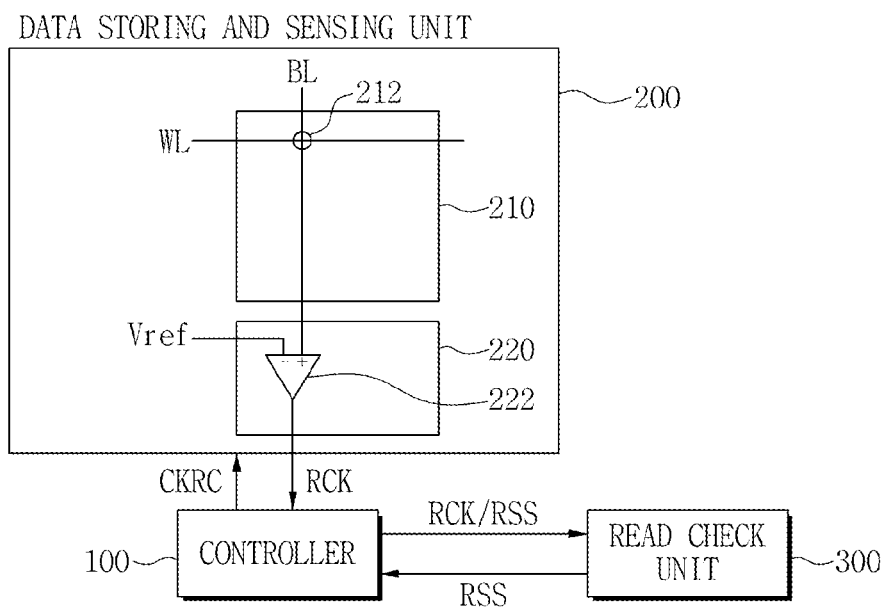
FIG. 1 is a configuration diagram showing a data read start decision device in accordance with an example embodiment of inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys inventive concepts to those skilled in the art. In the drawings, the sizes and relative sizes of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Although example embodiments may be discussed using the term "unit," it should be understood that components referred to as "units" may also be referred to as circuits. For example, the data storing and sensing unit may also be referred to as the data storing and sensing circuit. Similarly, the transfer unit may be referred to as the transfer circuit.

FIG. 1 is a configuration diagram showing a data read start decision device in accordance with an example embodiment of inventive concepts.

Referring to FIG. 1, a data read start decision device 10 may include a controller 100, a data storing and sensing unit 200, and a read check unit 300.

The controller 100, when power is applied, may transmit a code key read command CKRC including an address in which code key data is stored, to the data storing and sensing unit 200, and receive read code key data RCK from the data storing and sensing unit 200.

The controller 100, when receiving the read code key data RCK, may transmit the read code key data RCK to the read check unit 300, or generate a read start signal RSS, and transfer the read start signal RSS and the read code key data RCK to the read check unit 300.

The controller 100, when receiving the read start signal RSS from the read check unit 300, may start reading environment setting data from the data storing and sensing unit 200.

The data storing and sensing unit 200 may include a plurality of bit-lines BL, a plurality of word-lines WL, and a data storage cell array 210 including a data storage cell 212 disposed at an intersection of each bit-line BL and each word-line WL, and a sensing unit 220 including a sensing circuit 222 of which an input terminal (+) at one terminal is connected to the bit-line BL, and an input terminal (−) at the other terminal is connected to a reference voltage Vref.

The data storing and sensing unit 200 may read the code key data from a data storage cell 212 in which the code key data is stored among the data storage cell array 210, in response to the code key read command CKRC from the controller 100, and transmit the read code key data read from the data storage cell 212 to the controller 100.

The data storage cell array 210 may store the code key data and the environment setting data.

The data storage cell 212 may be a one-time programmable (OTP) non-volatile memory cell or an anti-fuse cell.

The sensing unit 220 may read data stored in the data storage cell 212 through the sensing circuit 222, and then transmit the read data to the controller 100.

The sensing circuit 222 may sense data stored in the data storage cell 212 connected a corresponding bit-line BL using a voltage of the bit-line BL and the reference voltage Vref.

The read check unit 300, when receiving the read code key data RCK and the read start signal RSS from the controller 100, may retransmit the received read start signal RSS to the controller 100 using the read code key data RCK, and when receiving the read code key data RCK from the controller 100, may generate a read start signal RSS using the read code key data RCK, and transmit the generated read start signal RSS to the controller 100.

Figure 2A:
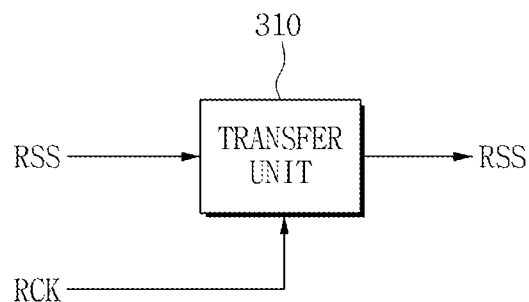
FIG. 2A is a block diagram showing an example of a read check unit in accordance with an example embodiment of inventive concepts.

FIG. 2A is a block diagram showing an example of the read check unit 300 in accordance with an example embodiment of inventive concepts.

Referring to FIGS. 1 and 2A, the read check unit 300 may include a transfer unit 310 which transfers the received read start signal RSS to the controller 100 in response to the read code key data RCK.

The transfer unit 310, when the read code key data RCK is exactly read without any read error, may transfer the read start signal RSS to the controller 100 in response to the read code key data. However, when a read error occurs in the read code key data RCK, the read start signal RSS may not be transferred to the controller 100.

The transfer unit 310 may include a latch circuit or a flip-flop circuit which transfers the read start signal RSS.

Figure 2B:
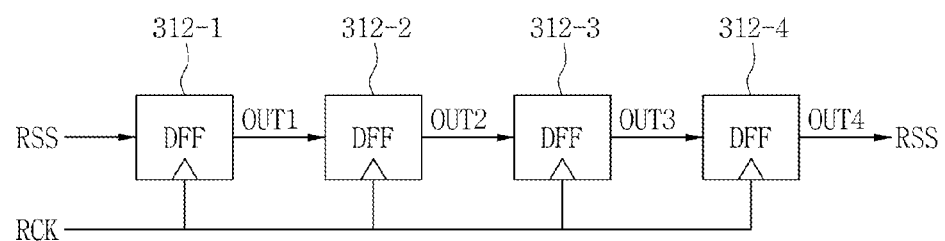
FIG. 2B is a diagram showing an example of a transfer unit of FIG. 2A being configured of D-flip-flops connected in series.

FIG. 2B is a diagram showing an example of the transfer unit 310 of FIG. 2A being configured of D-flip-flops connected in series.

The read start signal RSS may be transmitted through a first flip-flop 312-1, a second flip-flop 312-2, a third flip-flop 312-3, and a fourth flip-flop 312-4, in response to the read code key data RCK.

The read code key data RCK may be input to a clock terminal of each flip-flop in the form of a serial signal.

Figure 3:
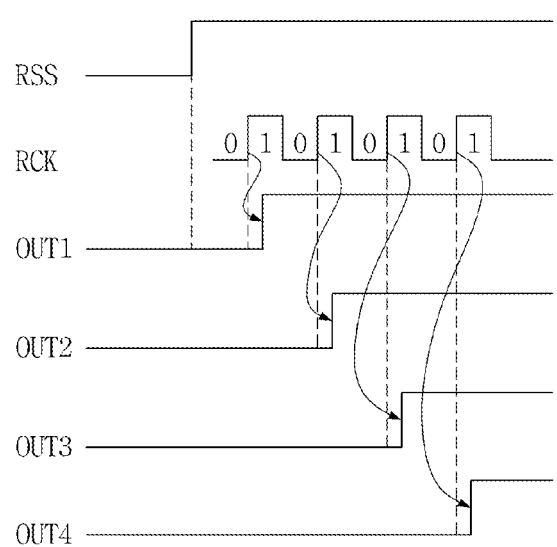
FIG. 3 is an example operation timing diagram for the configuration in FIG. 2B.

FIG. 3 is an example operation timing diagram of the configuration in FIG. 2B.

Referring to FIGS. 2B and 3, when code key data is set to an 8-bit data 01010101, and the code key data is read without any error, read code key data RCK may be input to the clock terminal of each flip-flop as a serial signal of 01010101.

The read start signal RSS at logic high may be input to the first flip-flop 312-1, and the first flip-flop 312-1 may transfer the read start signal RSS as an output signal OUT1 in response to a first rising edge of the read code key data RCK.

The output signal OUT1 may be input to the second flip-flop 312-2, and the second flip-flop 312-2 may transfer the read start signal RSS as an output signal OUT2 in response to a second rising edge of the read code key data RCK.

The output signal OUT2 may be input to the third flip-flop 312-3, and the third flip-flop 312-3 may transfer the read start signal RSS as an output signal OUT3 in response to a third rising edge of the read code key data RCK.

The output signal OUT3 may be input to the fourth flip-flop 312-4, and the fourth flip-flop 312-4 may transfer the read start signal RSS as an output signal OUT4 in response to a fourth rising edge of the read code key data RCK. The output signal OUT4 may be transferred to the controller 100.

When a read error occurs in the code key data, the read code key data RCK may not have a required number of rising edges for completing transferring of the read start signal RSS, and therefore, the read start signal RSS may not be transferred to the controller 100.

It is obvious that, in some embodiments, the transfer unit may have a structure in which four falling edge triggered flip-flops are connected in series. In this case, the code key data may be formed of 10101010.

According to the above two examples, when the code key data is configured of n bits including alternately repeating 0s and 1s, the transfer unit 310 may have a structure in which n/2 edge triggered flip-flops are connected in series.

In some embodiments, the read start signal RSS may be generated not from the controller 100, but from the read check unit 300 in response to power supplying, and input to the transfer unit 310.

Figure 4:
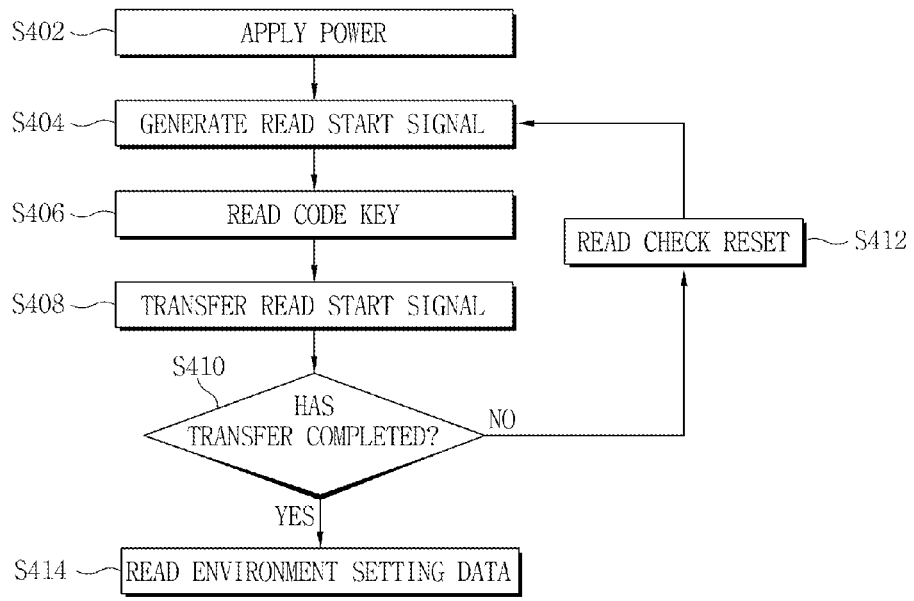
FIG. 4 is a flowchart for describing a method of deciding data read start in accordance with an example embodiment of inventive concepts.

FIG. 4 is a flowchart for describing a method of deciding data read start in accordance with an example embodiment of inventive concepts.

Referring to FIGS. 1, 2A, and 4, power may be supplied to the data read start decision device 10 (S402), and the read start signal RSS may be generated in response to power supplying (S404).

The read start signal RSS may be generated from the controller 100 to be transferred to the transfer unit 310 of the read check unit 300, or generated from the read check unit 300 to be input to the transfer unit 310 of the read check unit 300.

Next, the controller 100 may command the data storing and sensing unit 200 to read the code key data, and receive the read code key data RCK from the data storing and sensing unit 200 (S406).

Next, the transfer unit 310 may receive the read start signal RSS, and transfer the read start signal RSS in response to the read code key data RCK (S408).

Next, the controller 100 may decide whether the read start signal RSS is received (S410).

When the read start signal RSS is not transferred, a read check reset in which an input terminal of each flip-flop of the transfer unit 310 is reset to an initial state, may be performed (S412), and the process may return to operation S404.

When the read start signal RSS is transferred, the controller 100 may start reading the environment setting data by controlling the data storing and sensing unit 200, and set an operation environment according to the read environment setting data (S414).

Figure 5:
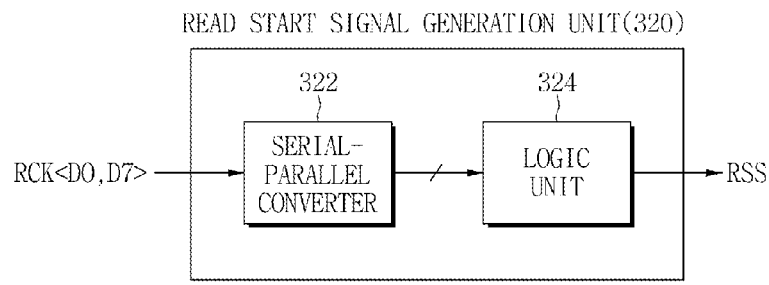
FIG. 5 is a configuration diagram showing an example of a read check unit in accordance with an example embodiment of inventive concepts.

FIG. 5 is a configuration diagram showing an example of a read check unit in accordance with an example embodiment of inventive concepts.

Referring to FIGS. 1 and 5, the read check unit 300 may include a read start signal generation unit 320 which outputs a read start signal RSS in response to the read code key data RCK which is received from the controller 100 in the form of a serial signal. The read start signal generation unit 320, when a preset code key data is accurately read without any read error, may generate and output the read start signal RSS.

The read start signal generation unit 320 may include a serial-parallel converter 322 which receives the read code key data RCK <D0, D7> in the form of an 8-bit serial signal and converts the read code key data RCK <D0, D7> to the form of an 8-bit parallel signal to be output, and a logic unit 324 which outputs a read start signal RSS in response to the parallel-converted read code key data received from the serial-parallel converter 322.

Figure 6:
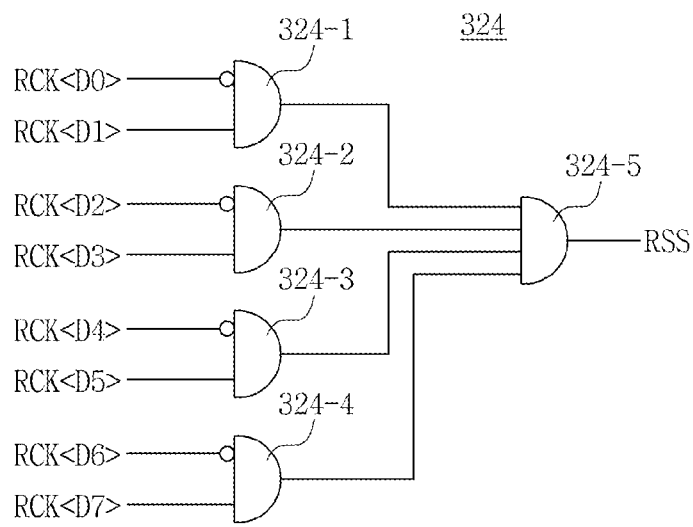
FIG. 6 is diagram showing an example of a logic structure of the logic unit in FIG. 5.

FIG. 6 is an example of a logic structure of the logic unit 324 in FIG. 5.

Referring to FIG. 6, the logic unit 324 may include four first logic gates 324-1, 324-2, 324-3, and 324-4 which receive the parallel-converted read code key data, and a second logic gate 324-5 which receives outputs of the first logic gates 324-1, 324-2, 324-3, and 324-4.

When the preset code key data is 01010101, and the read code key data is accurately read without any read error, since each of a first-bit data RCK <D0>, a third-bit data RCK <D2>, a fifth-bit data RCK <D4>, and a seventh-bit data RCK <D6> among the read code key data RCK is at logic low, and each of a second-bit data RCK <D1>, a fourth-bit data RCK <D3>, a sixth-bit data RCK <D5>, and an eighth-bit data RCK <D7> is at logic high, all of outputs of the first logic gates 324-1, 324-2, 324-3, and 324-4 may be at logic high, and the second logic gate 324-5 may output a read start signal RSS at logic high.

When the preset code key data is 01010101, and a read error occurs in the read code key data, the second logic gate 324-5 may output a signal at logic low, wherein the signal at logic low may not enable the read start signal RSS.

Figure 7:
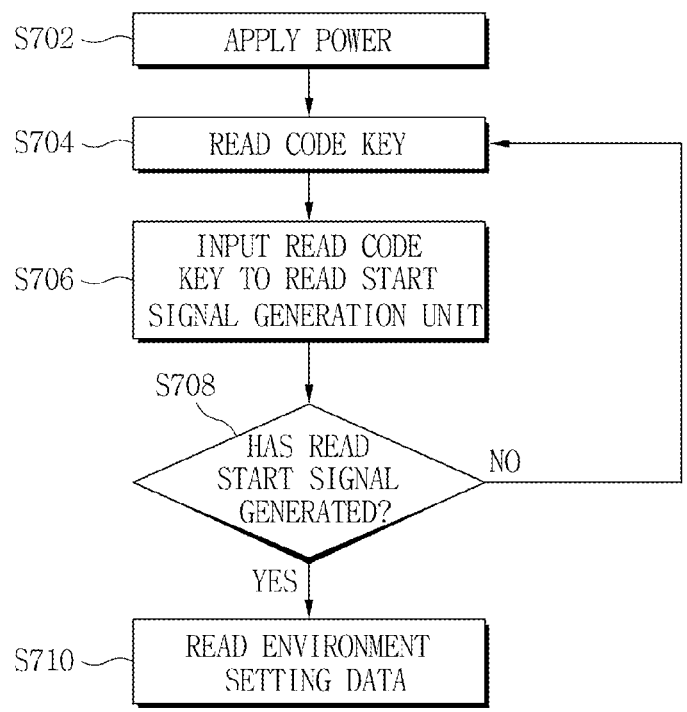
FIG. 7 is a flowchart for describing a method of deciding data read start in accordance with an example embodiment of inventive concepts.

FIG. 7 is a flowchart for describing a method of deciding data read start in accordance with an example embodiment of inventive concepts.

Referring to FIGS. 1, 5, and 7, power may be applied on the data read start decision device 10 (S702).

Next, the controller 100 may command the data storing and sensing unit 200 to read the code key data, and receive the read code key data RCK from the data storing and sensing unit 200 (S704).

Next, the read start signal generation unit 320 may receive the read code key data RCK, and perform a logic operation based on the read code key data RCK (S706).

Next, the controller 100 may receive an output signal from the read start signal generation unit 320 and decide whether a read start signal is enabled or not (S708). When the output signal is at logic high, the controller 100 may decide that the read start signal is enabled. When the output signal is at logic low, the controller 100 may decide that the read start signal is not enabled.

When the read start signal is generated, the controller 100 may start reading the environment setting data by controlling the data storing and sensing unit 200, and set an operation environment according to the read environment setting data (S710).

When the read start signal is not enabled, the process may return to operation S704.

Figure 18:
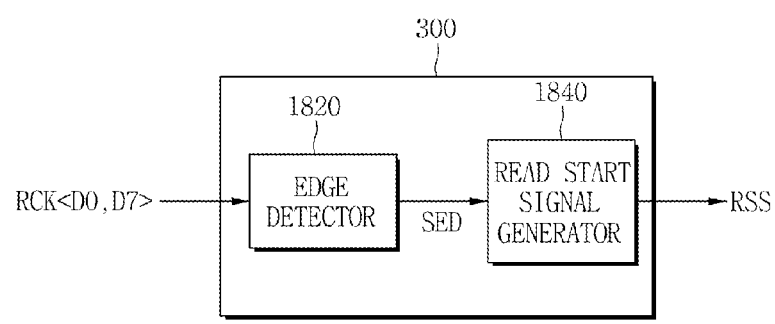
FIG. 18 is a configuration diagram of an example of a read check unit in accordance with an example embodiment of inventive concepts.

FIG. 18 is a configuration diagram of an example of a read check unit in accordance with an example embodiment of inventive concepts.

Referring to FIGS. 1 and 18, a read check unit 300 may include an edge detector 1820 which detects a rising edge and a falling edge in bits of the read code key data RCK <D0, D7> which is a serial signal received from the controller 100, and a read start signal generator 1840 which receives an edge detection signal SED from the edge detector 1820, decides whether an edge is detected at a specific point in time based on the edge detection signal SED, and generates and outputs a read start signal RSS. The read start signal generator 1840, when accurately reading the preset code key data without any read error, may generate and output the read start signal RSS.

Figure 19:
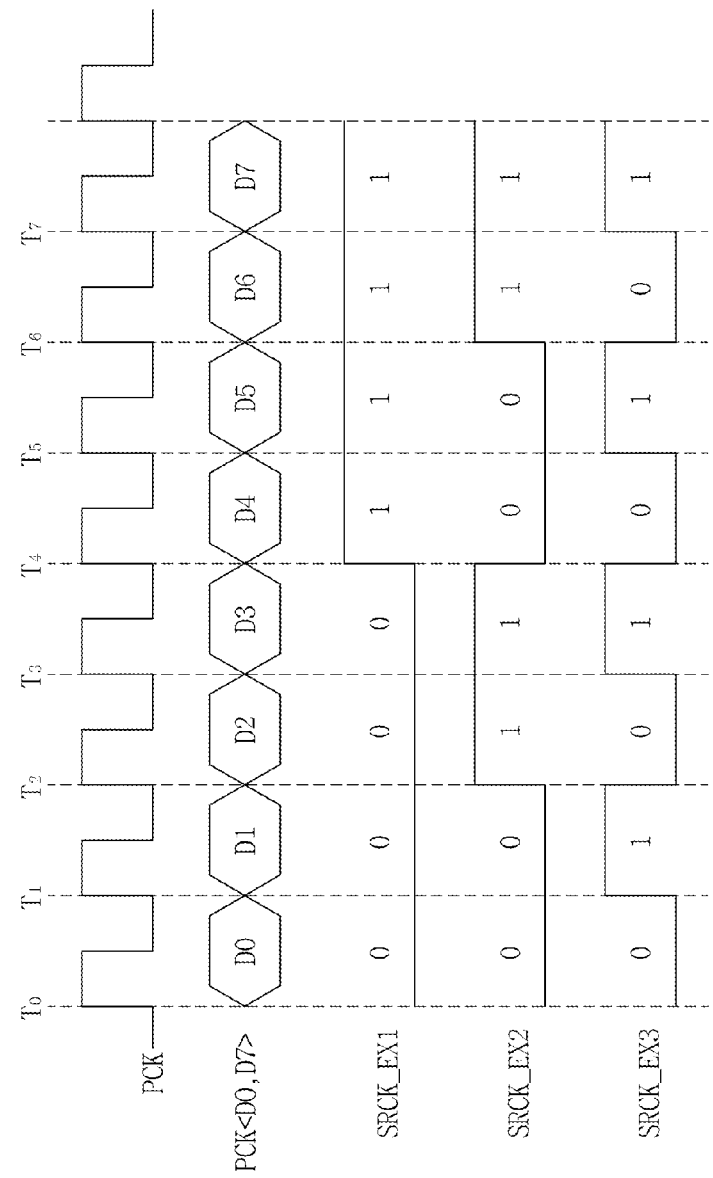
FIG. 19 is a timing chart for describing example operation of the read check unit of FIG. 18.

FIG. 19 is a timing chart for describing example operation of the read check unit 300 of FIG. 18.

Referring to FIGS. 18 and 19, the read code key data RCK <D0, D7> may be sequentially input to the edge detector 1820 in the form of a serial signal in response to a clock pulse signal PCK. The serial signal of the read code key data may include one rising edge or falling edge, or more.

First, SRCK_EX1, when the preset code key data is 8-bit 00001111 and read without any read error, may represent a serial-type read code key data signal input to the edge detector 1820.

The edge detector 1820 may detect a rising edge at time T4 and transmit a corresponding edge detection signal SED to the read start signal generator 1840. The read start signal generator 1840 may decide that the rising edge occurred at time T4, and a falling edge did not occur, in response to the edge detection signal SED, and generate and output a read start signal RSS.

When the rising edge is detected at time other than T4, or the falling edge is detected, the read start signal RSS may not be enabled since a read error occurred.

Next, SRCK_EX2, when a preset code key data is 8-bit 00110011 and read without any read error, may represent a serial-type read code key data signal input to the edge detector 1820.

The edge detector 1820 may detect a rising edge at each of times T2 and T6, and a falling edge at time T4, and transmit a corresponding edge detection signal SED to the read start signal generator 1840. The read start signal generator 1840 may decide that the rising edges occurred at times T2 and T6, and the falling edge occurred at time T4 in response to the edge detection signal SED, and output an enabled read start signal RSS.

When the rising edge is detected at time other than T2 and T6, or the falling edge is detected at time other than T4, the read start signal RSS may not be enabled since a read error occurred.

Next, SRCK_EX3, when a preset code key data is 8-bit 01010101 and read without any read error, may represent a serial-type read code key data signal input to the edge detector 1820.

The edge detector 1820 may detect a rising edge at each of times T1, T3, T5, and T7, and a falling edge at each of times T2, T4, and T6, and transmit a corresponding edge detection signal SED to the read start signal generator 1840. The read start signal generator 1840 may decide that the rising edges occurred at times T1, T3, T5, and T7 in response to the edge detection signal SED, and output an enabled read start signal RSS.

When the rising edge is detected at time other than T1, T3, T5, and T7, or the falling edge is detected at time other than T2, T4, and T6, the read start signal RSS may not be enabled since a read error occurred.

Figure 8:
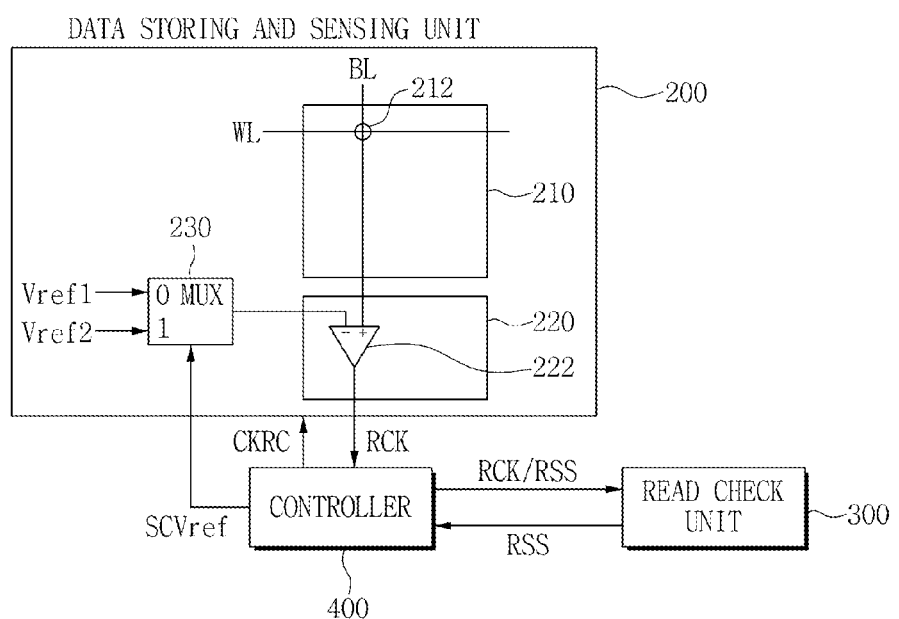
FIG. 8 is a configuration diagram showing a data read start decision device in accordance with an example embodiment of inventive concepts.

FIG. 8 is a configuration diagram of a data read start decision device in accordance with an example embodiment of inventive concepts.

Referring to FIG. 8, a data read start decision device 20 may include a controller 400, a data storing and sensing unit 200, and a read check unit 300.

The configuration in FIG. 8 is based on the configuration in FIG. 1, and hereinafter differences will only be described in detail.

The controller 400 may perform a given, desired or predetermined (threshold) number of read check processes which include reading a code key data, transmitting the read code key data RCK to the read check unit 300, and confirming that a corresponding read start signal is received, and output a reference voltage control signal SCVref at logic high to a multiplexer 230 when the read start signal is not received within the given, desired or predetermined (threshold) number of read check processes.

The multiplexer 230 may selectively apply a first reference voltage Vref1 or a second reference voltage Vref2 to a comparison voltage input terminal (−) of a sensing circuit 222, in response to the reference voltage control signal SCVref. That is, the multiplexer 230 may output the first reference voltage Vref1 when the reference voltage control signal SCVref is at logic low, and the second reference voltage Vref2 when the reference voltage control signal SCVref is at logic high.

Here, the second reference voltage Vref2 may be lower than the first reference voltage Vref1. In this embodiment, when read errors in the code key data continuously occur while the given, desired or predetermined (threshold) number of read check processes are repeated, the controller 400 may output a reference voltage control signal SCVref by which a reference voltage applied to the sensing circuit 222 is changed to the second reference voltage Vref2 lower than the first reference voltage Vref1 in order to increase sensing sensitivity of the sensing circuit 222.

In this embodiment, the sensing condition may be changed in such a way that the sensing sensitivity increases by changing the reference voltage of the sensing circuit 222. However, in other example embodiments, the sensing sensitivity may increase by changing a voltage level of a bit-line BL connected to the sensing circuit 222.

Figure 9:
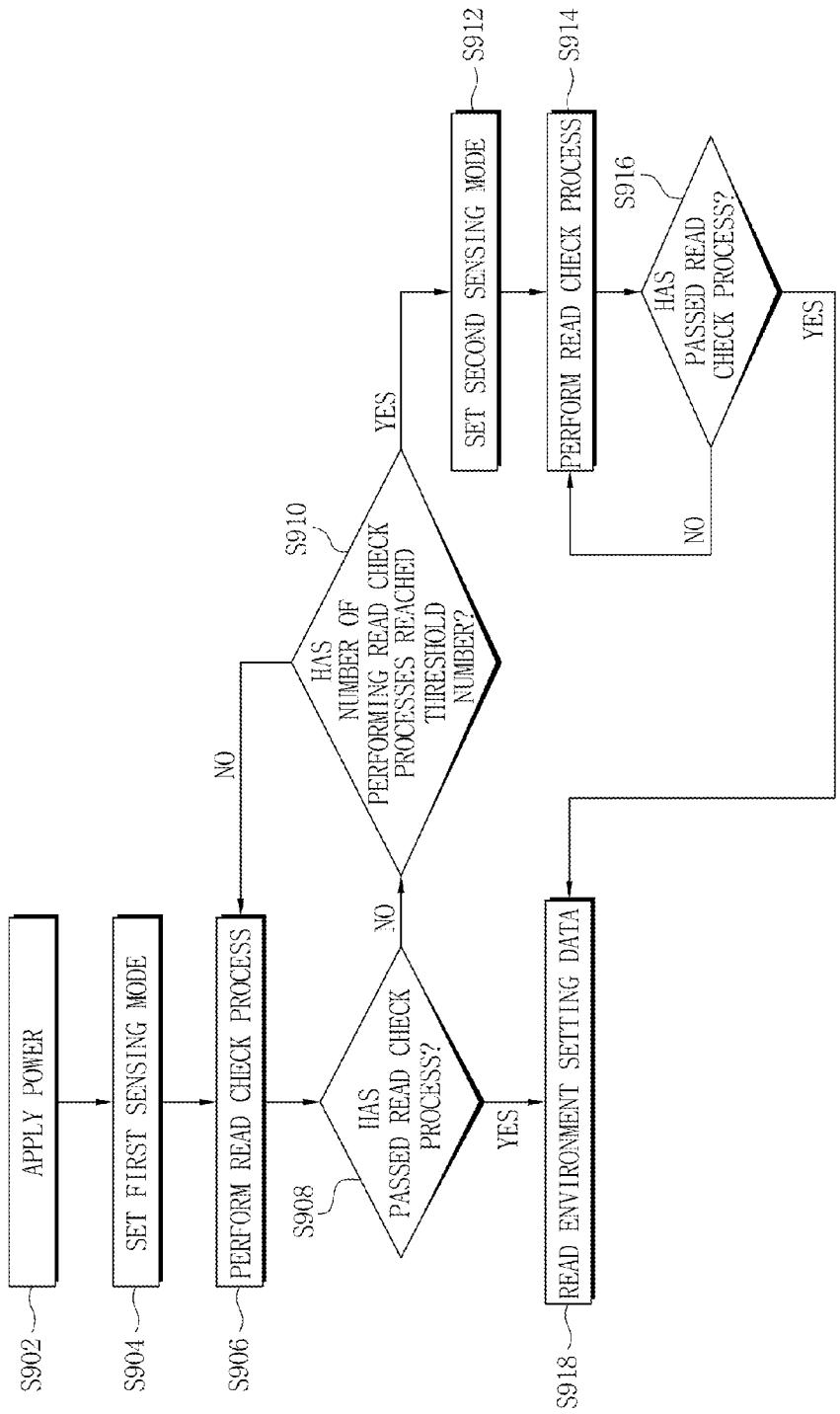
FIG. 9 is a flowchart for describing a method of deciding data read start in accordance with an example embodiment of inventive concepts.

FIG. 9 is a flowchart for describing a method of deciding data read start in accordance with an example embodiment of inventive concepts.

Referring to FIGS. 8 and 9, power is supplied on the data read start decision device 20 (S902).

Next, the controller 400 may set a first sensing mode by outputting a reference voltage control signal SCVref at logic low (S904).

Next, the controller 400 may control to perform a read check process (S906). Here, the read check process may indicate that operations S404 to S412 of FIG. 4, or operations S704 to S708 of FIG. 7 are performed. Next, the controller 400 may decide whether the read check process is passed (S908). For example, the controller 400 may decide whether a read start signal is enabled in a single read check process.

Next, when the read check process is passed, the controller 400 may start reading the environment setting data (S918), and when the read check process is not passed, the controller 400 may decide whether the read check process is repeatedly performed as many as given, desired or predetermined (threshold) times (S910).

Next, when the read check process is not repeatedly performed as many as given, desired or predetermined (threshold) times, the process may return to operation S906, and when the read check process is repeatedly performed as many as given, desired or predetermined (threshold) times, the controller 400 may set a second sensing mode by which sensing sensitivity of the sensing circuit increases, by outputting a reference voltage control signal SCVref at logic high (S912).

Next, the controller 400 may control to perform the read check process (S914). Here, the read check process indicates that operations S404 to S412 in FIG. 4, or operations S704 to S708 in FIG. 7 are performed.

Next, the controller 400 may decide whether the read check process is passed (S916).

Next, when the read check process is passed, the controller 400 may start reading the environment setting data (S918), and when the read check process is not passed, the process may return to operation S914.

Figure 10:
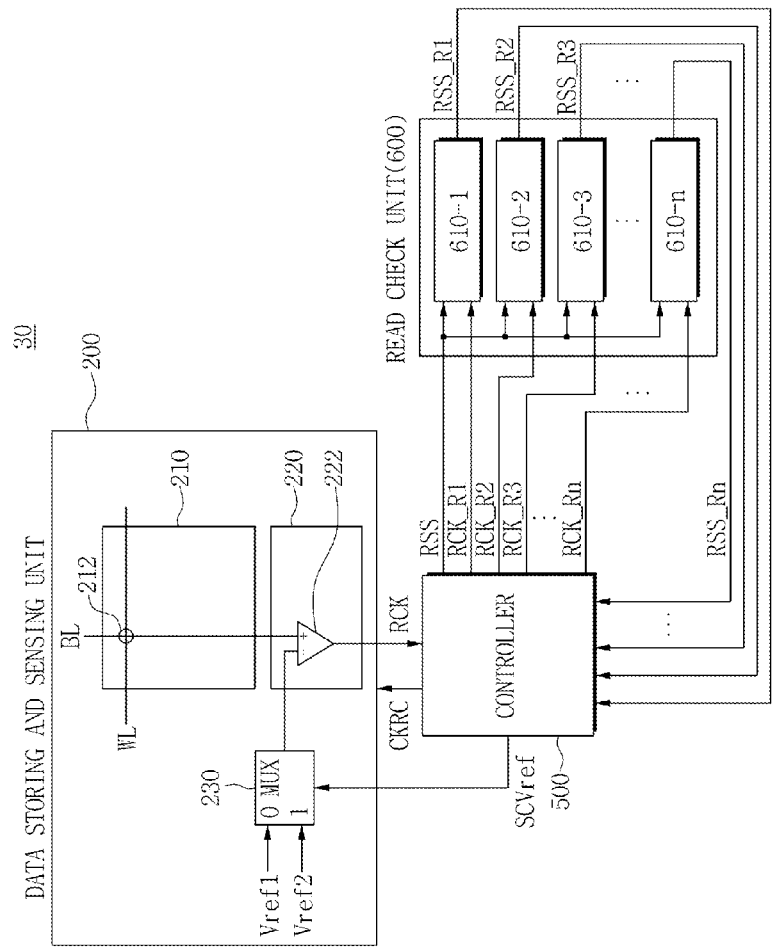
FIG. 10 is a configuration diagram showing a data read start decision device in accordance with an example embodiment of inventive concepts.

FIG. 10 is a configuration diagram showing a data read start decision device in accordance with an example embodiment of inventive concepts.

Referring to FIG. 10, a data read start decision device 30 may include a controller 500, a data storing and sensing unit 200, and a read check unit 600.

The configuration in FIG. 10 is based on the configuration in FIG. 1, and hereinafter differences will only be described in detail.

The controller 500 may transmit a read start signal RSS to each of sectional transfer blocks 610-1, 610-2, 610-3, . . . , and 610-n of the read check unit 600, transmit sectional code key data RCK_R1, RCK_R2, RCK_R3, . . . , RCK_Rn into which a read code key data RCK is divided by section, to corresponding sectional transfer blocks 610-1, 610-2, 610-3, . . . , and 610-n of the read check unit 600, and decide whether sectional read start signals RSS_R1, RSS_R2, RSS_R3, . . . , RSS_Rn are received from the sectional transfer blocks 610-1, 610-2, 610-3, . . . , and 610-n.

Figure 11:
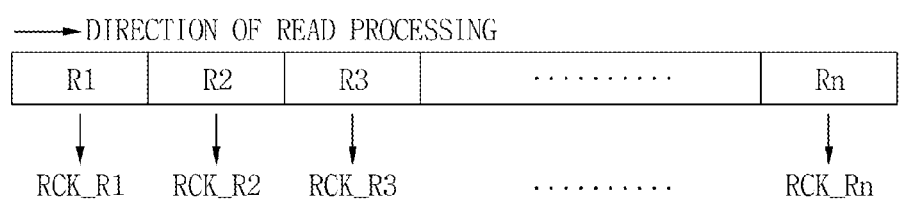
FIG. 11 is a diagram for describing sectional code key data in accordance with an example embodiment of inventive concepts.

FIG. 11 is a diagram for describing sectional code key data in accordance with an example embodiment of inventive concepts.

When preset code key data includes m-bits, the code key data may be divided by m/n-bit according to the order of reading the read code key data RCK, to be separated into from first section R1 to nth section Rn.

The code key data included in the first section R1 may be the first sectional code key data RCK_R1, the code key data included in the second section R2 may be the second sectional code key data RCK_R2, the code key data included in the third section R3 may be the third sectional code key data RCK_R3, . . . , and the code key data included in nth section Rn may be the nth sectional code key data RCK_Rn.

The controller 500, when the sectional read start signals are not received from all of the sectional transfer blocks, and when the sectional read start signals are not received from a given, desired or predetermined (threshold) number of consecutive sectional transfer blocks from the last sectional transfer block (610-n) of the read check unit 600 (for example, if the given, desired or predetermined (threshold) number is four, the consecutive sectional transfer blocks from the last sectional transfer block may be 610-n, 610-(n−1), 610-(n−2), and 610-(n−3)), may output a reference voltage control signal SCVref at logic high to a multiplexer 230.

The multiplexer 230 may selectively apply a first reference voltage Vref1 or a second reference voltage Vref2 to a comparison voltage input terminal (−) of a sensing circuit 222 in response to the reference voltage control signal SCVref. That is, the multiplexer 230, may output the first reference voltage Vref1 when the reference voltage control signal SCVref is at logic low, and the second reference voltage Vref2 when the reference voltage control signal SCVref is at logic high.

Here, the second reference voltage Vref2 may be lower than the first reference voltage Vref1. In this embodiment, when a read error occurs with respect to a backend section at which the code key data is read late in time, the controller 500 may output the reference voltage control signal SCVref which changes a reference voltage applied to the sensing circuit 222 to the second reference voltage Vref2 lower than the first reference voltage Vref1 in order to increase sensing sensibility of the sensing circuit 222.

In this embodiment, the sensing sensitivity may increase by changing the reference voltage of the sensing circuit 222. However, in some embodiments, the sensing sensitivity may increase by changing a voltage level of a bit-line BL connected to the sensing circuit 222.

The read check unit 600 may include the same number of sectional transfer blocks 610-1, 610-2, 610-3, . . . , and 610-n as the number of sections of the code key data.

Each sectional transfer block may receive a read start signal and the corresponding sectional code key data, and output a corresponding sectional read start signal by transferring the read start signal in response to a corresponding sectional code key data.

When the sectional code key data is 8-bit, the processes described in FIGS. 2B and 3 may be applied to each sectional transfer block.

In some embodiments, the read start signal RSS is not received from the controller 500, but generated from the read check unit 600 to be input to each sectional transfer block.

In other embodiments, the sectional transfer block may include a read start signal generation unit as shown in FIGS. 5 and 6. In this case, transmission of the read start signal from the controller 500 to the read check unit 600 may not be required. To assume all of these two cases, the sectional transfer block may be named as a sectional read check block.

Figure 12:
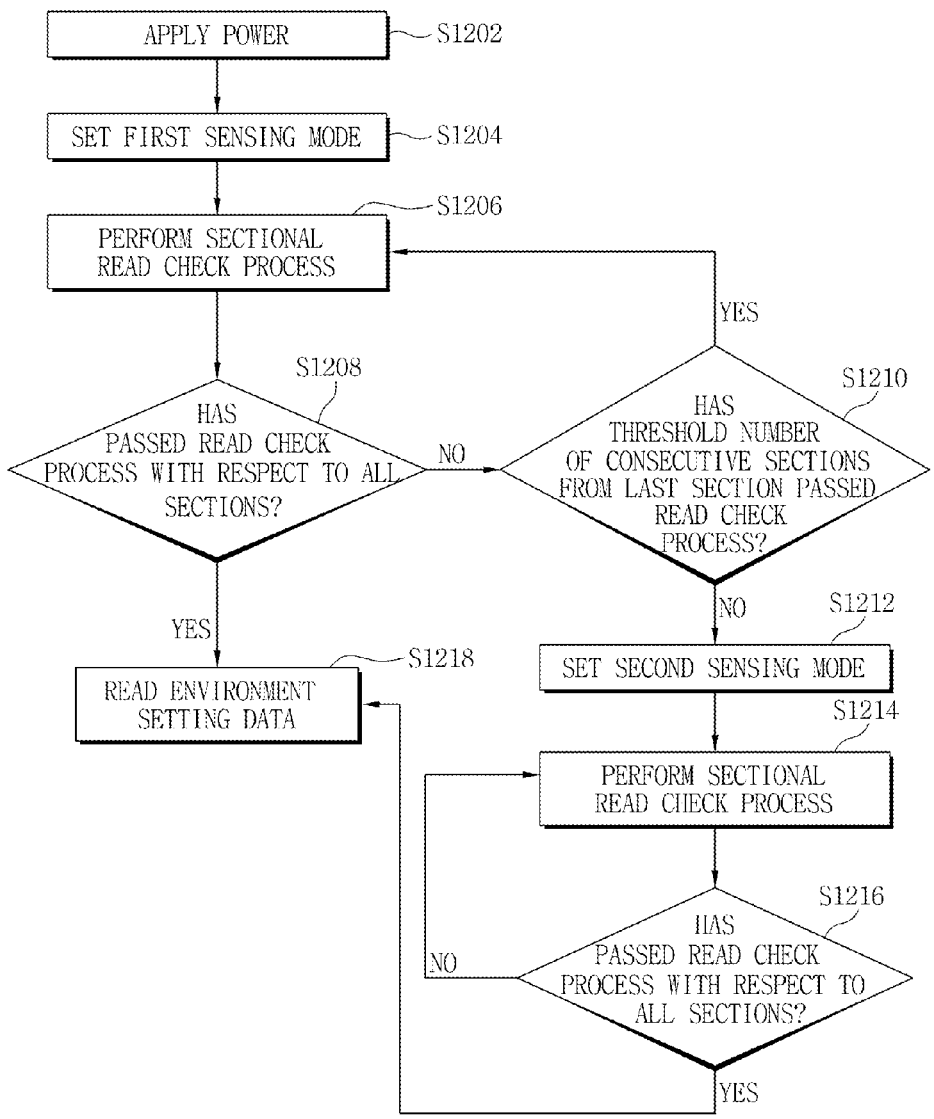
FIG. 12 is a flowchart for describing a method of deciding data read start in accordance with an example embodiment of inventive concepts.

FIG. 12 is a flowchart for describing a method of deciding data read start in accordance with an example embodiment of inventive concepts.

Referring to FIGS. 10 and 12, power is supplied to the data read start decision device 30 (S1202).

Next, the controller 500 may set a first sensing mode by outputting a reference voltage control signal SCVref at logic low (S1204).

Next, the controller 500 may control to perform a sectional read check process (S1206). Here, the sectional read check process indicates performing operations S412, and S404 to S408 in FIG. 4, or operations S704 to S706 in FIG. 7 by each section.

Next, the controller 500 may decide whether the read check process is passed with respect to all sections (S1208). That is, the controller 500 may decide whether the read start signal is enabled with respect to all sections in the sectional read check process.

Next, when the read check process is passed with respect to all sections, the controller 500 may start reading environment setting data (S1218). When the read check process is not passed with respect to all sections, the controller 500 may decide whether or not the read check process is passed with respect to a given, desired or predetermined (threshold) number of consecutive sections from the last section (S1210).

Next, when the read check process is passed with respect to the given, desired or predetermined (threshold) number of consecutive sections from the last section, the process may return to operation S1206. When the read check process is not passed with respect to the given, desired or predetermined (threshold) number of consecutive sections from the last section, the controller 500 may set a second sensing mode by which sensing sensibility of the sensing circuit 222 increases, by outputting a reference voltage control signal SCVref at logic high (S1212).

Next, the controller 500 may control to perform the sectional read check process (S1214). Here, the sectional read check process indicates performing operations S412, and S404 to S408 in FIG. 4, or operations S704 to S706 in FIG. 7 by each section.

Next, the controller 500 may decide whether the read check process is passed with respect to all sections (S1216).

Next, the controller 500 may start reading the environment setting data when the read check process is passed with respect to all sections (S1218), and the process may return to operation 5124 when the read check process is not passed with respect to all sections.

Figure 13:
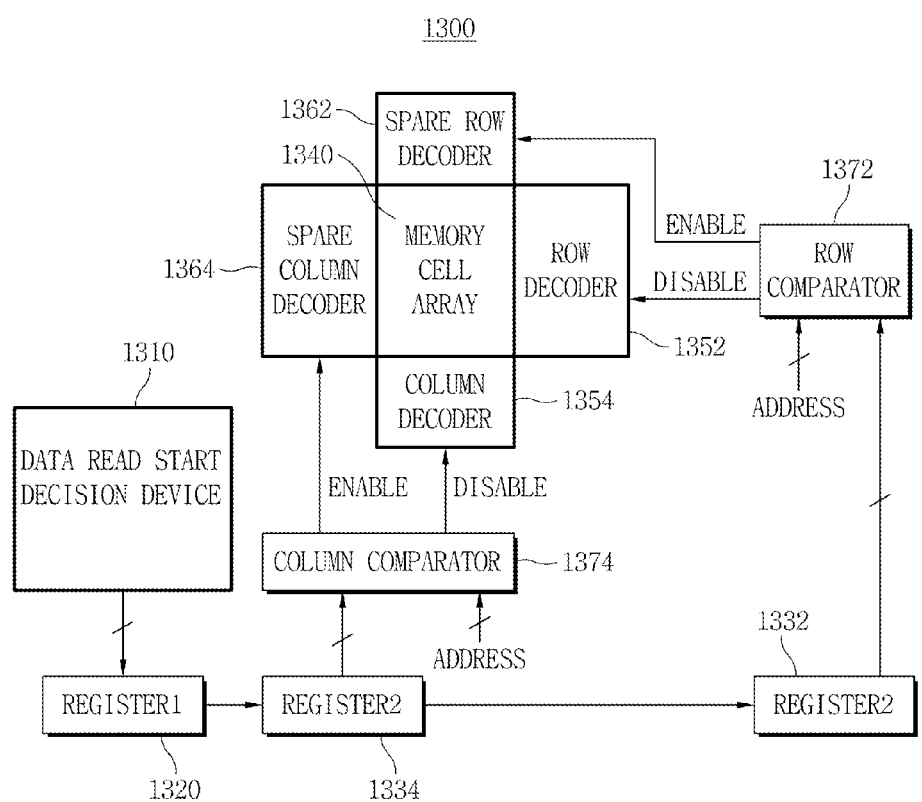
FIG. 13 is a block diagram showing a semiconductor memory device including a data read start decision device in accordance with an example embodiment of inventive concepts.

FIG. 13 is a block diagram showing a semiconductor memory device including a data read start decision device in accordance with an example embodiment of inventive concepts.

Referring to FIG. 13, a semiconductor memory device 1300 may include a data read start decision device 1310, a first register 1320 which stores environment setting data output from the data read start decision device 1310 and transfers the environment setting data to second registers 1332 and 1334, the second registers 1332 and 1334 configured to store the environment setting data transferred from the first register 1320, a memory cell array 1340 configured to store data, row and column decoders 1352 and 1354 configured to drive a word-line WL and a bit-line BL of the memory cell array 1340, spare row and spare column decoders 1362 and 1364 configured to drive a redundancy cell, and row and column comparators 1372 and 1374 configured to compare address information of a defect cell and an external address information.

One of the above described example embodiments of inventive concepts may be applied in the data read start decision device 1310.

The first register 1320 may store the environment setting data output from the data read start decision device 1310, and then transfer the environment setting data to the second registers 1332 and 1334. An operation environment of the semiconductor memory device may be set using the environment setting data stored in the second registers 1332 and 1334.

The second registers 1332 and 1334 may sequentially receive the environment setting data from the first register 1320 bit by bit, and store the environment setting data. The second registers 1332 and 1334 may be arranged adjacent to various circuit blocks which require the environment setting data. For example, the second register 1332 which stores row address information of a defect cell, may be arranged adjacent to the row comparator 1372. In addition, the second register 1334 which stores column address information of a defect cell, may be arranged adjacent to the column comparator 1374.

The row comparator 1372 may compare a row address provided from the outside, to a row address of the defect cell, and drive the row decoder 1352 or the spare row decoder 1362 depending on the results of the comparison. Similarly, the column comparator 1374 may compare a column address provided from the outside to a column address of the defect cell, and drive the column decoder 1354 or the spare column decoder 1364 depending on the results of the comparison.

Each of the row and column comparators 1372 and 1374 may include a plurality of logic devices configured to compare address information from the outside to address information of the defect cell.

Figure 14:
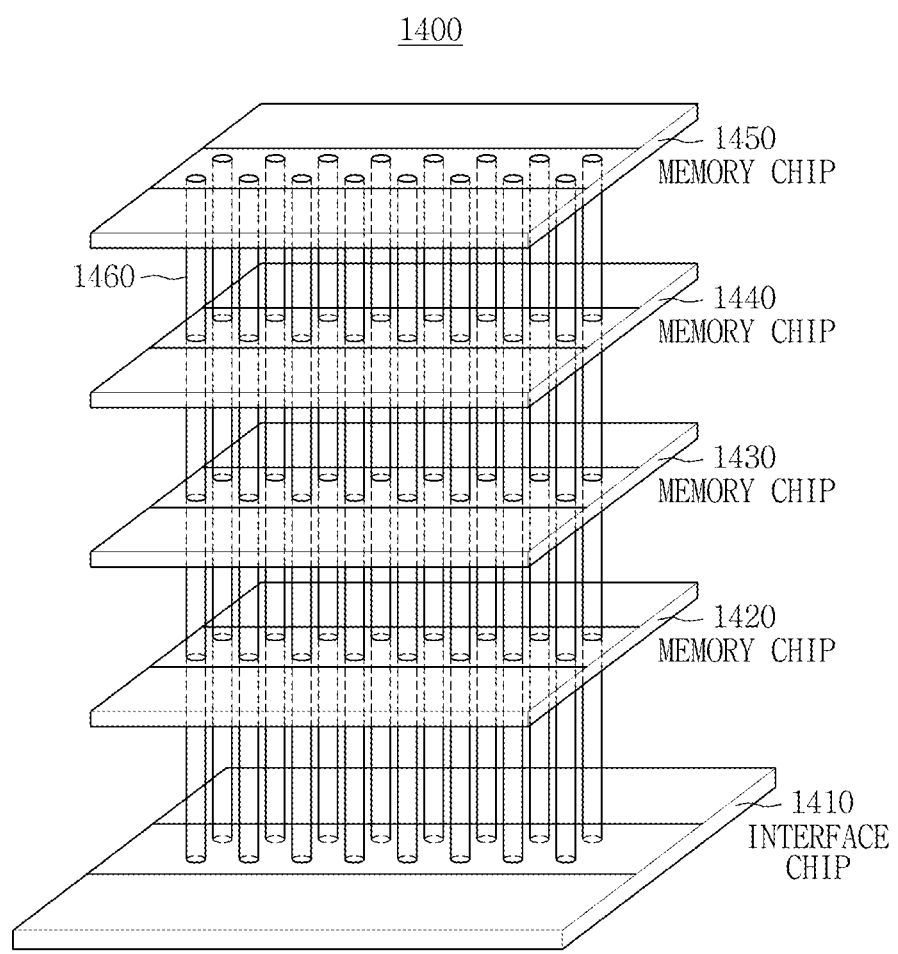
FIG. 14 is a schematic perspective view showing a stacked semiconductor device including a semiconductor memory device having a data read start decision device in accordance with an example embodiment of inventive concepts.

FIG. 14 is a schematic perspective view showing a stacked semiconductor device including a semiconductor memory device having a data read start decision device in accordance with an example embodiment of inventive concepts.

Referring to FIG. 14, a stacked semiconductor device 1400 may include an interface chip 1410 and memory chips 1420, 1430, 1440, and 1450 electrically connected by through-silicon vias 1460. Although the through-silicon vias 1460 arranged in two rows are illustrated in FIG. 14, the stacked semiconductor device 1400 may include any number of through-silicon vias 1460.

The memory chips 1420, 1430, 1440, and 1450 included in the stacked semiconductor device 1400 may include a data read start decision device in accordance with an example embodiment of inventive concepts. The interface chip 1410 may perform interfacing between the memory chips 1420, 1430, 1440, and 1450, and an external apparatus.

Figure 15:
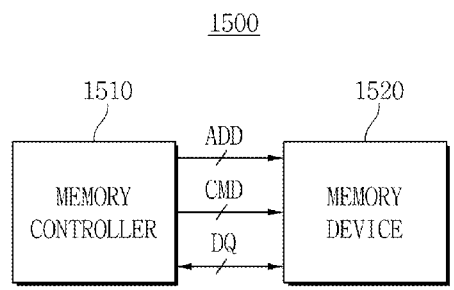
FIG. 15 is a block diagram showing an example of a memory system including a semiconductor memory device having a data read start decision device in accordance with an example embodiment of inventive concepts.

FIG. 15 is a block diagram showing an example of a memory system including a semiconductor memory device having a data read start decision device in accordance with an example embodiment of inventive concepts.

Referring to FIG. 15, a memory system 1500 may include a memory controller 1510 and a semiconductor memory device 1520.

The memory controller 1510 may generate an address signal ADD and a command CMD, and provide the address signal ADD and the command CMD to the semiconductor memory device 1520 through buses. Data DQ may be transmitted from the memory controller 1510 to the semiconductor memory device 1520 through the buses, or from the semiconductor memory device 1520 to the memory controller 1510 through the buses.

The semiconductor memory device 1520 may include a data read start decision device in accordance with an example embodiment of inventive concepts.

Figure 16:
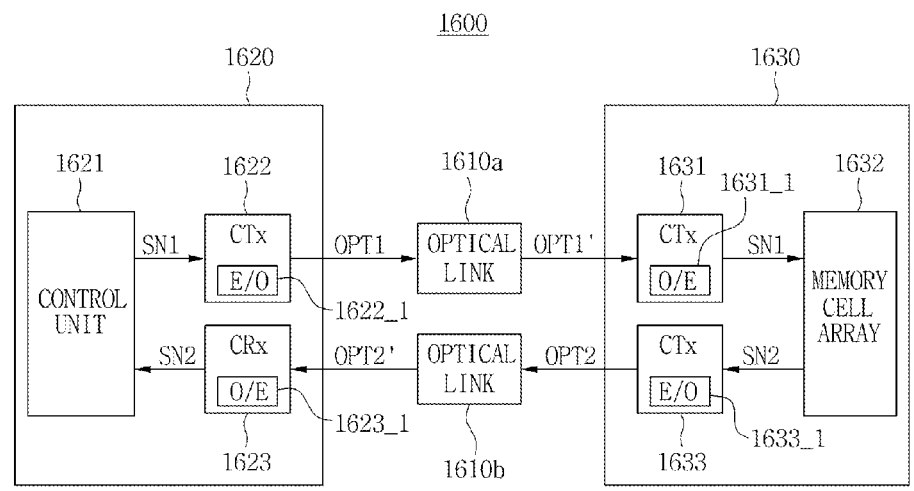
FIG. 16 is a block diagram showing an example of a memory system including a semiconductor memory device and an optical link in accordance with an example embodiment of inventive concepts.

FIG. 16 is a block diagram showing a memory system including a semiconductor memory device and an optical link in accordance with an example embodiment of inventive concepts.

Referring to FIG. 16, a memory system 1600 may include a controller 1620, a semiconductor memory device 1630, and a plurality of optical link 1610*a* and 1610*b* interconnecting the controller 1620 and the semiconductor memory device 1630. The controller 1620 may include a control unit 1621, a first transmission part 1622, and a first reception part 1623. The control unit 1621 may transmit a control signal SN1 to the first transmission part 1622.

The first transmission part 1622 may include a first optical modulator 1622_1, and the first optical modulator 1622_1 may convert a control signal SN1, which is an electric signal, to a first optical transmission signal OPT1 to be transmitted to the optical link 1610*a*.

The first reception part 1623 may include a first optical demodulator 1623_1, and the first optical demodulator 1623_1 may convert the second optical reception signal OPT2' received from the optical link 1610*b* to a data signal SN2 which is an electric signal, to be transmitted to the control unit 1621.

The semiconductor memory device 1630 may include a second reception part 1631, a memory cell array 1632, and a second transmission part 1633. The second reception part 1631 may include a second optical demodulator 1631_1, and the second optical demodulator 1631_1 may convert an first optical reception signal OPT1' from the optical link 1610*a* to a control signal SN1, which is an electric signal, to be transmitted to the memory cell array 1632.

The memory cell array 1632 may write data or transmit the data signal SN2 which is output from the memory cell array 1632 to the second transmission part 1633 according to the control of the control signal SN1.

The second transmission part 1633 may include a second optical modulator 1633_1, and the second optical modulator 1633_1 may convert the data signal SN2 which is an electric signal, to a second optical data signal OPT2 to be transmitted to the optical link 1610*b*.

The semiconductor memory device 1630 may include a data read start decision device in accordance with an example embodiment of inventive concepts.

Figure 17:
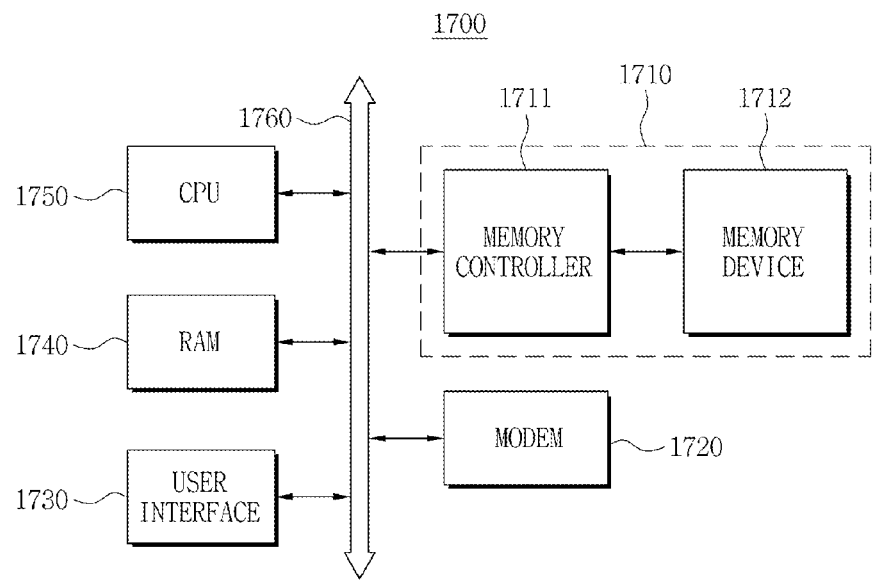
FIG. 17 is a block diagram showing an example of an information processing system including a semiconductor memory device in accordance with an example embodiment of inventive concepts.

FIG. 17 is a block diagram showing an example of an information processing system including a semiconductor memory device in accordance with an example embodiment of inventive concepts.

Referring to FIG. 17, a semiconductor memory device in accordance with an example embodiment of inventive concepts may be installed in an information processing system 1700, such as a mobile apparatus or a desktop computer. The information processing system 1700 may include a semiconductor memory system 1710, a modem 1720, a central processing unit (CPU) 1750, a RAM 1740, and a user interface 1730 which are electrically connected to a system bus 1760.

The semiconductor memory system 1710 may include a memory controller 1711 and a semiconductor memory device 1712. Data processed by the CPU 1750 or data input from the outside may be stored in the semiconductor memory device 1712.

The semiconductor memory device 1712 may include a data read start decision device in accordance with an example embodiment of inventive concepts.

Although not shown in FIG. 17, those skilled in the art will readily appreciate that the CPU 1700 may further include an application chipset, a camera image processor, input/output device, etc.

In accordance with example embodiments of inventive concepts, data read error may be effectively suppressed and/or prevented by deciding an appropriate data read start point.

The foregoing is illustrative of example embodiments and is not to be construed as limiting thereof. Although a few example embodiments have been described, those skilled in the art will readily appreciate that many modifications are possible without materially departing from the novel teachings and advantages. Accordingly, all such modifications are intended to be included within the scope of inventive concepts as defined in the claims. In the claims, means-plus-function clauses are intended to cover the structures described herein as performing the recited function, and not only structural equivalents but also equivalent structures.

The invention claimed is:

1. A data read start decision device, comprising:
   a storing circuit configured to store code key data;
   a controller configured to start reading environment setting data from the storing circuit in response to a read start signal; and
   a read check circuit configured to detect rising and falling edges in code key data read from the storing circuit, and to output the read start signal to the controller when a location of each of the detected rising and falling edges in the read code key data corresponds to a reference location, wherein the read check circuit is further configured to at least one of,
      receive the read start signal from the controller and output the read start signal to the controller by transferring the read start signal to the controller, and
      generate the read start signal based on the read code key data and output the generated read start signal to the controller.

2. The data read start decision device of claim 1, wherein the read code key data includes n-bit data with an alternately repeating pattern having equal numbers of 0 and 1 bits, and the read check circuit is further configured to output the read start signal to the controller when the read code key data has n/2 rising edges or n/2 falling edges.

3. The data read start decision device of claim 1, wherein the read code key data includes n-bit data with an alternately repeating pattern having equal numbers of 0 and 1 bits, the read check circuit includes n/2 transfer devices connected in series, and the n/2 transfer devices are configured to sequentially transfer the read start signal in response to a rising edge or a falling edge in the read code key data.

4. The data read start decision device of claim 1, wherein the read check circuit comprises:
   a logic circuit configured to generate the read start signal when the read code key data is the same as the stored code key data.

5. The data read start decision device of claim 1, further comprising:
   a sensing circuit configured to sense data stored in the storing circuit; and wherein the controller is further configured to,
set the sensing circuit in a first sensing mode and perform a first read check operation with respect to the read code key data, and
when a read check operation condition is satisfied, set the sensing circuit in a second sensing mode and perform a second read check operation with respect to the read code key data.

6. The data read start decision device of claim 5, wherein a sensitivity of the sensing circuit in the second sensing mode is higher than the sensitivity of the sensing circuit in the first sensing mode.

7. The data read start decision device of claim 5, wherein the read check operation condition indicates whether a number of repetitions of a read check process has reached a threshold, the read check process including reading of the code key data from the storing circuit and the performing of the first read check operation with respect to the read code key data.

8. A data read start decision device, comprising:
a storing circuit configured to store code key data;
a read check circuit configured to output a read start signal in response to code key data read from the storing circuit, the read check circuit including n sectional read check blocks, and the read code key data being divided into n sections;
a controller configured to read environment setting data from the storing circuit in response to the read start signal; and
wherein each of the n sectional read check blocks is configured to at least one of,
receive the read start signal from the controller and transfer a section of the received read start signal to the controller in response to a corresponding section of the read code key data, and
generate a section of the read start signal based on the corresponding section of the read code key data and output the generated section of the read start signal to the controller.

9. The data read start decision device of claim 8, wherein the controller is configured to begin reading the environment setting data from the storing circuit when sections of the read start signal are received from all of the n sectional read check blocks.

10. The data read start decision device of claim 9, further comprising:
a sensing circuit configured to sense data stored in the storing circuit; and
wherein the controller is configured to,
set the sensing circuit in a first sensing mode, and perform a first sectional read check operation with respect to the n sections of the read code key data, and
when a sectional read check operation condition is satisfied, set the sensing circuit in a second sensing mode, and perform a second sectional read check operation with respect to the n sections of the read code key data.

11. The data read start decision device of claim 10, wherein the sectional read check operation condition indicates whether the first sectional read check operation has failed with respect to a threshold number of consecutive sections of the read code key data.

12. The data read start decision device of claim 8, wherein each of the n sections of the read code key data includes k-bit data with an alternately repeating pattern of equal numbers of 0 and 1 bits, and wherein each of the n sectional read check blocks is configured to transfer the section of the received read start signal to the controller when the corresponding section of the read code key data has k/2 rising edges or k/2 falling edges.

13. The data read start decision device of claim 8, wherein each of the n sections of the read code key data includes k-bit data with an alternately repeating pattern of equal numbers of 0 and 1 bits, and wherein each of the n sectional read check blocks includes,
k/2 transfer devices connected in series, the k/2 transfer devices being configured to sequentially transfer the section of the read start signal in response to a rising edge or a falling edge in the corresponding section of the read code key data.

14. The data read start decision device of claim 8, wherein each of the sectional read check blocks comprises:
a logic circuit configured to generate the section of the read start signal based on a comparison between bits of the corresponding section of the read code key data.

15. A data read start decision device, comprising:
a controller configured to read environment setting data from a storing circuit in response to a read start signal; and
a read check circuit configured to
detect rising and falling edges in code key data read from the storing circuit, and
output the read start signal to the controller when a location of each of the detected rising and falling edges in the read code key data corresponds to a reference location, the read start signal being one of (i) received from the controller and transferred to the controller, and (ii) generated by the read check circuit based on the read code key data.

16. The data read start decision device of claim 15, wherein the read code key data includes multi-bit data, and the read check circuit includes,
a plurality of transfer devices connected in series, the plurality of transfer devices being configured to sequentially transfer the read start signal to the controller in response to the detected rising and falling edges in the read code key data.

17. The data read start decision device of claim 15, further comprising:
a sensing circuit configured to sense data stored in the storing circuit; and
wherein the controller is configured to,
perform a first read check operation with respect to the read code key data, and
when a read check operation condition is satisfied, increase the sensitivity of the sensing circuit, read the code key data from the storing circuit, and perform a second read check operation with respect to the read code key data.

18. The data read start decision device of claim 15, wherein the read code key data includes n sections, and wherein the read check circuit includes,
n sectional read check blocks, each of the n sectional read check blocks being configured to at least one of,
receive the read start signal from the controller and transfer a section of the received read start signal to the controller in response to a corresponding section of the read code key data, and
generate a section of the read start signal in response to the corresponding section of the read code key data, and output the generated section of the read start signal to the controller.

19. The data read start decision device of claim 18, wherein the controller is configured to begin reading the environment setting data from the storing circuit when sections of the read start signal are received from all of the n sectional read check blocks.

\* \* \* \* \*